(12) United States Patent
Takata

(10) Patent No.: US 11,929,736 B2
(45) Date of Patent: Mar. 12, 2024

(54) MULTIPLEXER

(71) Applicant: Murata Manufacturing Co., Ltd., Nagaokakyo (JP)

(72) Inventor: Toshiaki Takata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 593 days.

(21) Appl. No.: 17/121,830

(22) Filed: Dec. 15, 2020

(65) Prior Publication Data

US 2021/0099159 A1 Apr. 1, 2021

Related U.S. Application Data

(63) Continuation of application No. PCT/JP2019/027074, filed on Jul. 9, 2019.

(30) Foreign Application Priority Data

Jul. 13, 2018 (JP) .................. 2018-133492

(51) Int. Cl.
*H03H 9/64* (2006.01)
*H03H 7/01* (2006.01)
(Continued)

(52) U.S. Cl.
CPC ........ *H03H 9/6483* (2013.01); *H03H 7/1741* (2013.01); *H03H 9/25* (2013.01); *H03H 9/6406* (2013.01); *H03H 9/725* (2013.01)

(58) Field of Classification Search
CPC ...... H03H 9/6483; H03H 9/25; H03H 9/6406; H03H 9/725; H03H 7/1741
See application file for complete search history.

(56) References Cited

U.S. PATENT DOCUMENTS 5,999,069 A   12/1999 Ushiroku
2004/0227585 A1  11/2004 Taniguchi et al.
(Continued)

FOREIGN PATENT DOCUMENTS

JP   05-167388 A   7/1993
JP   11-55067 A    2/1999
(Continued)

OTHER PUBLICATIONS

Official Communication issued in International Patent Application No. PCT/JP2019/027074, dated Sep. 10, 2019.

*Primary Examiner* — Samuel S Outten
(74) *Attorney, Agent, or Firm* — Keating & Bennett, LLP

(57) ABSTRACT

A multiplexer includes an antenna terminal, an inductance element, and a transmission-side filter and a reception-side filter connected to the antenna terminal. The transmission-side filter has a first pass band, and the reception-side filter has a second pass band. The reception-side filter is connected to the antenna terminal through the inductance element. A center frequency of the second pass band is higher than a center frequency of the first pass band. The reception-side filter includes parallel arm resonance portions including a first parallel arm resonance portion connected closest to the inductance element. An electrostatic capacitance of the first parallel arm resonance portion is larger than an electrostatic capacitance of any other parallel arm resonance portions.

17 Claims, 6 Drawing Sheets

(51) Int. Cl.
*H03H 9/25* (2006.01)
*H03H 9/72* (2006.01)

(56) References Cited

U.S. PATENT DOCUMENTS

| | | |
|---|---|---|
| 2006/0192633 A1 | 8/2006 | Kishimoto et al. |
| 2008/0116993 A1* | 5/2008 | Yamakawa ............ H03H 9/605 |
| | | 333/32 |
| 2008/0150652 A1 | 6/2008 | Itou |
| 2010/0244979 A1* | 9/2010 | Matsuda ................ H03H 9/725 |
| | | 333/100 |
| 2012/0112850 A1* | 5/2012 | Kim ........................ H03H 9/54 |
| | | 333/32 |
| 2012/0182088 A1 | 7/2012 | Inoue et al. |
| 2017/0331457 A1 | 11/2017 | Satoh |
| 2019/0028086 A1 | 1/2019 | Takamine |
| 2020/0153414 A1 | 5/2020 | Takamine |

FOREIGN PATENT DOCUMENTS

| | | |
|---|---|---|
| JP | 2008-160562 A | 7/2008 |
| JP | 2008-245310 A | 10/2008 |
| JP | 2012-151697 A | 8/2012 |
| JP | 2017-204744 A | 11/2017 |
| JP | 2019-022164 A | 2/2019 |
| WO | 2004/112246 A1 | 12/2004 |
| WO | 2019/017422 A1 | 1/2019 |

\* cited by examiner

FIG. 2A
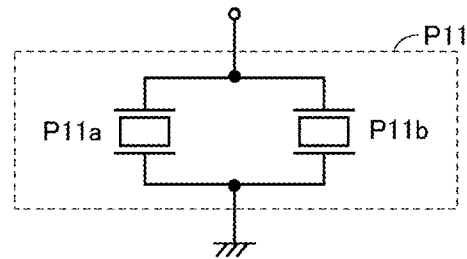
FIG. 2B
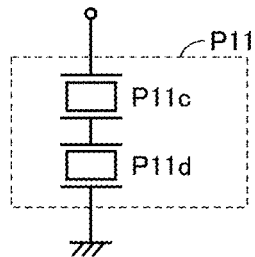
FIG. 3
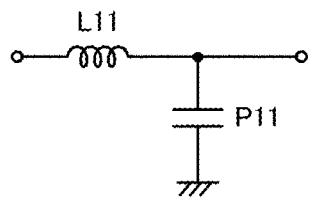
FIG. 4
|  | P11 | P12 | P13 | P14 |
|---|---|---|---|---|
| PRACTICAL EXAMPLE | 36.3 μm | 31.0 μm | 15.3 μm | 29.8 μm |
| COMPARATIVE EXAMPLE | 15.3 μm | 31.0 μm | 36.3 μm | 29.8 μm |
FIG. 5
|  | P11 | P12 | P13 | P14 |
|---|---|---|---|---|
| PRACTICAL EXAMPLE | 129 PAIRS | 87 PAIRS | 145 PAIRS | 52 PAIRS |
| COMPARATIVE EXAMPLE | 145 PAIRS | 87 PAIRS | 129 PAIRS | 52 PAIRS |

|  | P11 | P12 | P13 | P14 |
|---|---|---|---|---|
| PRACTICAL EXAMPLE | 2.05pF | 1.30pF | 0.97pF | 0.14pF |
| COMPARATIVE EXAMPLE | 0.97pF | 1.30pF | 2.05pF | 0.14pF |

|  | P11 | P12 | P13 | P14 |
|---|---|---|---|---|
| PRACTICAL EXAMPLE | 1884MHz | 1916MHz | 1911MHz | 1911MHz |
| COMPARATIVE EXAMPLE | 1895MHz | 1916MHz | 1906MHz | 1911MHz |

MULTIPLEXER

CROSS REFERENCE TO RELATED APPLICATIONS

This application claims the benefit of priority to Japanese Patent Application No. 2018-133492 filed on Jul. 13, 2018 and is a Continuation Application of PCT Application No. PCT/JP2019/027074 filed on Jul. 9, 2019. The entire contents of each application are hereby incorporated herein by reference.

BACKGROUND OF THE INVENTION

1. Field of the Invention

The present disclosure relates to a multiplexer and, more particularly, to a technique to improve isolation characteristics between filters included in the multiplexer.

2. Description of the Related Art

In mobile communication devices, such as mobile phones or smartphones, transmission and reception are typically performed by using a common antenna. Furthermore, in recent years, in transmission or reception, multiband communications are being promoted in which communications are performed by using multiple frequency bands. In such communication devices, to perform transmission and reception of signals in different frequency bands, a separation device (multiplexer) for separating a transmission signal and a reception signal according to frequency by using a plurality of filters corresponding to the respective frequency bands is widely used.

Japanese Unexamined Patent Application Publication No. 2008-245310 discloses a surface acoustic wave separator in which a transmission-side surface acoustic wave filter and a reception-side surface acoustic wave filter are connected to a common antenna terminal. In the surface acoustic wave separator in Japanese Unexamined Patent Application Publication No. 2008-245310, a low pass filter for impedance matching is disposed between a common connection point of both of the transmission-side surface acoustic wave filter and the reception-side surface acoustic wave filter and the antenna terminal. Furthermore, a phase matching element defined by an inductance element is connected between the common connection point and the reception-side surface acoustic wave filter.

In a multiplexer, such as the separator disclosed in Japanese Unexamined Patent Application Publication No. 2008-245310, a further improvement in the accuracy of separating signals having a plurality of different pass bands is demanded.

SUMMARY OF THE INVENTION

Preferred embodiments of the present invention provide multiplexers that each separate signals with a plurality of different pass bands, and improve attenuation characteristics outside a pass band to improve isolation characteristics between filters.

A multiplexer according to a preferred embodiment includes an antenna terminal, an inductance element, and a first acoustic wave filter and a second acoustic wave filter that are connected to the antenna terminal. The first acoustic wave filter has a first pass band, and the second acoustic wave filter has a second pass band. The second acoustic wave filter is connected to the antenna terminal through the inductance element. A center frequency of the second pass band is set to be higher than a center frequency of the first pass band. The second acoustic wave filter includes a plurality of parallel arm resonance portions including a first parallel arm resonance portion connected closest to the inductance element. Electrostatic capacitance of the first parallel arm resonance portion is larger than electrostatic capacitance of any other parallel arm resonance portions of the plurality of parallel arm resonance portions.

In the multiplexer including the first acoustic wave filter (transmission-side filter) and the second acoustic wave filter (reception-side filter) that are connected to the common antenna terminal, the inductance element is provided between the antenna terminal and the reception-side filter, and the electrostatic capacitance of the first parallel arm resonance portion located closest to the antenna terminal in the reception-side filter is set to be larger than the electrostatic capacitance of each of the other parallel arm resonance portions. Thus, isolation characteristics between the reception-side filter and the transmission-side filter are able to be improved while achieving impedance matching of each filter of the multiplexer.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 2A and 2B illustrate examples of another configuration of a parallel arm resonance portion in FIG. 1.

FIG. 3 illustrates an equivalent circuit of a low pass filter defined by an inductance element and the parallel arm resonance portion.

FIG. 4 illustrates an example of intersecting widths of IDT electrodes of parallel arm resonance portions in a reception-side filter in a practical example of a preferred embodiment of the present invention and a comparative example.

FIG. 5 illustrates an example of the numbers of pairs in the IDT electrodes of the parallel arm resonance portions in the reception-side filter in the practical example and the comparative example.

DETAILED DESCRIPTION OF THE PREFERRED EMBODIMENTS

Figure 1:
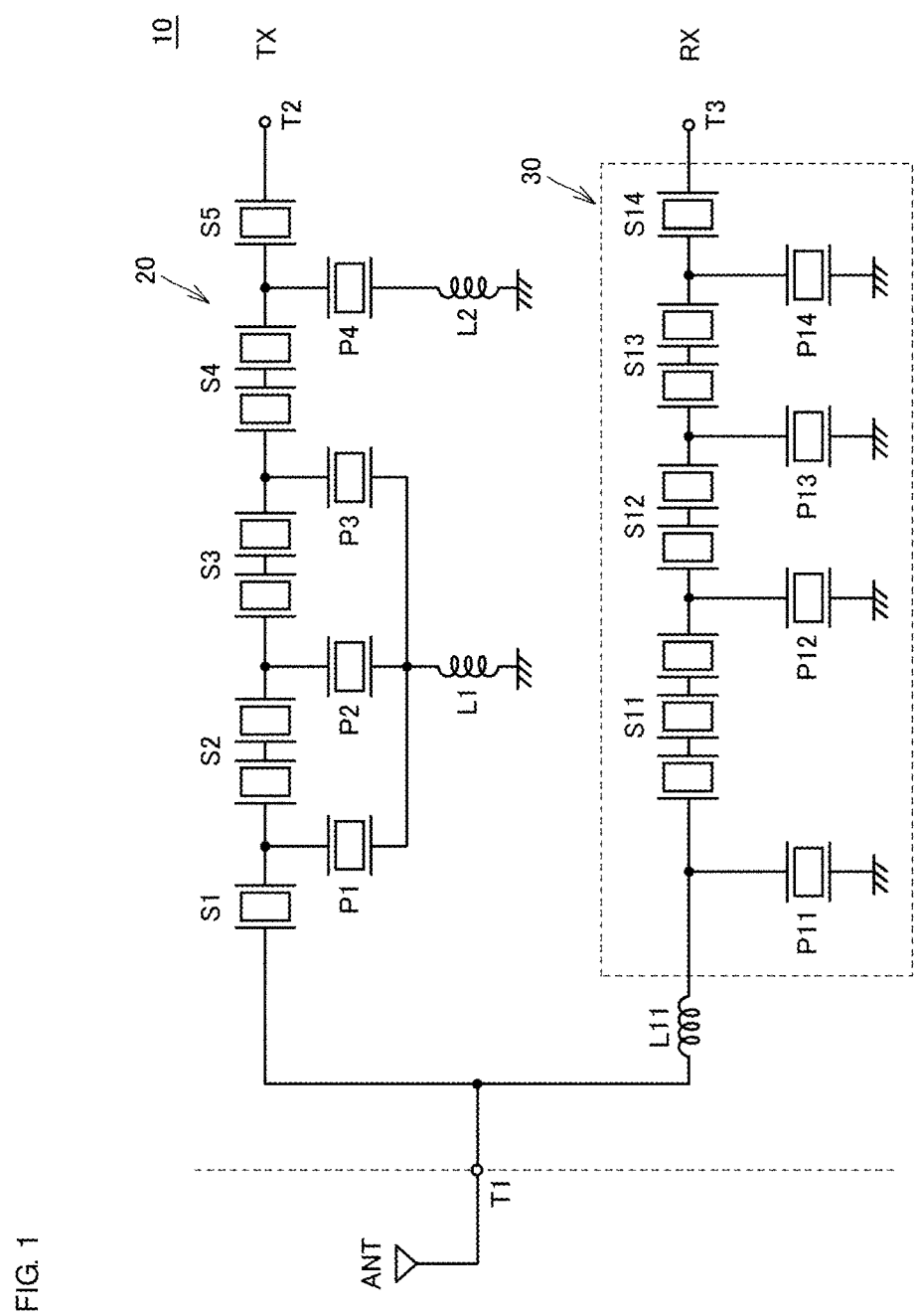
FIG. 1 illustrates a circuit configuration of a multiplexer according to a preferred embodiment of the present invention.

Preferred embodiments of the present disclosure will be described in detail below with reference to the drawings. Note that identical or corresponding elements or portions in the drawings are denoted by the same reference signs and a repeated description thereof is omitted.

Configuration of Multiplexer

FIG. 1 illustrates a circuit configuration of a multiplexer 10 according to a preferred embodiment of the present invention. Referring to FIG. 1, the multiplexer 10 includes an antenna terminal T1, and a transmission-side filter 20 and a reception-side filter 30 that are electrically connected to an antenna ANT at the antenna terminal T1. An example of the multiplexer 10 illustrated in FIG. 1 is a duplexer including two filters.

The transmission-side filter 20 is a ladder filter connected between the antenna terminal T1 and a transmission terminal T2 and subjects a signal received at the transmission terminal T2 to filtering to output the signal from the antenna ANT. The transmission-side filter 20 preferably has a pass band (first pass band: BND1) ranging from, for example, about 1850 MHz to about 1915 MHz.

The transmission-side filter 20 includes series arm resonance portions S1 to S5 connected in series between the antenna terminal T1 and the transmission terminal T2, and parallel arm resonance portions P1 to P4. Each of the series arm resonance portions S1 to S5 and parallel arm resonance portions P1 to P4 includes at least one acoustic wave resonator. In the example illustrated in FIG. 1, although it is described that each of the series arm resonance portions S1 and S5 and parallel arm resonance portions P1 to P4 includes one acoustic wave resonator and each of the series arm resonance portions S2 to S4 includes two acoustic wave resonators, the number of acoustic wave resonators included in each resonance portion is not limited to this and is selected as appropriate in accordance with filter characteristics. As an acoustic wave resonator, for example, a Surface Acoustic Wave (SAW) resonator, a Bulk Acoustic Wave (BAW) resonator, or the like may preferably be used.

One end of the parallel arm resonance portion P1 is connected to a connection point between the series arm resonance portion S1 and the series arm resonance portion S2, and the other end is connected to a ground potential through an inductor L1. One end of the parallel arm resonance portion P2 is connected to a connection point between the series arm resonance portion S2 and the series arm resonance portion S3, and the other end is connected to the ground potential through the inductor L1 as is the case with the parallel arm resonance portion P1. One end of the parallel arm resonance portion P3 is connected to a connection point between the series arm resonance portion S3 and the series arm resonance portion S4, and the other end is connected to the ground potential through the inductor L1 as is the case with the parallel arm resonance portions P1 and P2. One end of the parallel arm resonance portion P4 is connected to a connection point between the series arm resonance portion S4 and the series arm resonance portion S5, and the other end is connected to the ground potential through an inductor L2.

The reception-side filter 30 is a ladder filter connected between the antenna terminal T1 and a reception terminal T3 and subjects a signal received at the antenna ANT to filtering to output the signal from the reception terminal T3. The reception-side filter 30 preferably has a pass band (second pass band: BND2) ranging from, for example, about 1930 MHz to about 1995 MHz. In other words, a center frequency of the pass band BND2 of the reception-side filter 30 is set to be higher than a center frequency of the pass band BND1 of the transmission-side filter 20. The reception-side filter 30 is connected to the antenna terminal T1 through an inductor L11 to provide impedance matching.

The reception-side filter 30 includes series arm resonance portions S11 to S14 connected in series between the inductor L11 and the reception terminal T3, and parallel arm resonance portions P11 to P14. Each of the series arm resonance portions S11 to S14 and parallel arm resonance portions P11 to P14 includes at least one acoustic wave resonator. In the reception-side filter 30 as well as in the transmission-side filter 20, the number of acoustic wave resonators included in each resonance portion is not limited to the case in FIG. 1 and is selected as appropriate in accordance with filter characteristics. Furthermore, as an acoustic wave resonator to be used, a SAW resonator, a BAW resonator, or the like, for example, may preferably be used. For example, with respect to the parallel arm resonance portion P11, a plurality of acoustic wave resonators (for example, acoustic wave resonators P11a and P11b) may be connected in parallel as illustrated in FIG. 2A, or a plurality of acoustic wave resonators (for example, acoustic wave resonators P11c and P11d) may be connected in series as illustrated in FIG. 2B. Alternatively, a series connection and a parallel connection may be provided.

One end of the parallel arm resonance portion P11 is connected to a connection point between the inductor L11 and the series arm resonance portion S11, and the other end is connected to the ground potential. One end of the parallel arm resonance portion P12 is connected to a connection point between the series arm resonance portion S11 and the series arm resonance portion 512, and the other end is connected to the ground potential. One end of the parallel arm resonance portion P13 is connected to a connection point between the series arm resonance portion S12 and the series arm resonance portion S13, and the other end is connected to the ground potential. One end of the parallel arm resonance portion P14 is connected to a connection point between the series arm resonance portion S13 and the series arm resonance portion S14, and the other end is connected to the ground potential.

The transmission-side filter 20 corresponds to a "first acoustic wave filter", and the reception-side filter 30 corresponds to a "second acoustic wave filter".

In a multiplexer having such a configuration, it is known that a parallel arm resonance portion in each filter defines and functions as electrostatic capacitance outside a frequency band from a resonant frequency of an acoustic wave resonator included in the parallel arm resonance portion to an anti-resonant frequency. As illustrated in FIG. 1, when an inductance element (inductor L11 in FIG. 1) is connected in series between the reception-side filter 30 of the multiplexer 10 and the antenna terminal T1, outside the pass band BND2 of the reception-side filter 30, a low pass filter illustrated in FIG. 3 is defined by the inductor L11 and the parallel arm resonance portion P11 disposed closest to an antenna terminal T1 side in the reception-side filter 30.

In the case where a cutoff frequency of this low pass filter is within the pass band BND1 of the transmission-side filter 20 or is higher than the pass band BND1 (in other words, in the case where a pass band of the low pass filter overlaps the pass band BND1 of the transmission-side filter 20), attenuation in the pass band BND1 of the transmission-side filter 20 as seen from the antenna terminal T1 to the reception-side filter 30 is not able to be provided, and isolation characteristics between the transmission-side filter 20 and the reception-side filter 30 may decrease. Thus, to reduce or prevent the isolation characteristics between the transmission-side filter 20 and the reception-side filter 30 from decreasing, the cutoff frequency of the low pass filter defined by the inductor L11 and the parallel arm resonance portion P11 is reduced, and attenuation in the pass band BND1 of the transmission-side filter 20 has to be provided.

Here, assuming that inductance of the inductor L11 is L and electrostatic capacitance of the parallel arm resonance portion P11 is C, a cutoff frequency fc of the low pass filter illustrated in FIG. 3 is given by the following Expression (1).

$$fc = 1/2\pi\sqrt{(LC)} \qquad (1)$$

From Expression (1), to reduce the cutoff frequency fc of the low pass filter and provide attenuation in the pass band BND1 of the transmission-side filter 20, the inductance of the inductor L11 and/or the electrostatic capacitance of the parallel arm resonance portion P11 have/has to be increased. However, when the inductance of the inductor L11 is increased, the cutoff frequency fc is reduced, but loss at the inductor L11 increases, resulting in the possibility that the insertion loss of the entire reception-side filter 30 may deteriorate.

Thus, in the present preferred embodiment, the electrostatic capacitance of the parallel arm resonance portion P11 is increased to reduce the cutoff frequency fc of the low pass filter. At this time, increases in electrostatic capacitance of all of the parallel arm resonance portions P11 to P14 in the reception-side filter 30 cause an increase in insertion loss of the reception-side filter 30. For this reason, in the present preferred embodiment, of the parallel arm resonance portions P11 to P14, the electrostatic capacitance of the parallel arm resonance portion P11 is set to be larger than the electrostatic capacitance of each of the other parallel arm resonance portions P12 to P14. This reduces the cutoff frequency fc while reducing or preventing an increase in loss of the entire reception-side filter 30 caused by the parallel arm resonance portions and enables an improvement in the isolation characteristics between the transmission-side filter 20 and the reception-side filter 30.

For the cutoff frequency fc of the low pass filter, the electrostatic capacitance of the parallel arm resonance portion P11 closest to the antenna terminal T1 (that is, the inductor L11) is most dominant, but the cutoff frequency fc is determined by the combined capacitance in the entire reception-side filter 30. Then, the closer a parallel arm resonance portion is to the antenna terminal T1, the more greatly the parallel arm resonance portion affects the cutoff frequency fc. Thus, it is preferable that the parallel arm resonance portions P11 to P14 are set in descending order of electrostatic capacitance from the antenna terminal T1 side. In other words, assuming that the electrostatic capacitance of the parallel arm resonance portion P11, electrostatic capacitance of the parallel arm resonance portion P12, electrostatic capacitance of the parallel arm resonance portion P13, and electrostatic capacitance of the parallel arm resonance portion P14 are respectively C1, C2, C3, and C4, when the relationship of C1>C2>C3>C4 is achieved, the cutoff frequency fc can be set to be lower. This further increases attenuation of the low pass filter in the pass band BND1 of the transmission-side filter 20 and enables a further improvement in the isolation characteristics between the transmission-side filter 20 and the reception-side filter 30.

As described above, each parallel arm resonance portion defines and functions as electrostatic capacitance outside a frequency band from a resonant frequency of an acoustic wave resonator included in the parallel arm resonance portion to an anti-resonant frequency. In the frequency band between the resonant frequency and the anti-resonant frequency, however, the parallel arm resonance portion defines and functions as an inductance element. In that case, in the frequency band between the resonant frequency and the anti-resonant frequency, the low pass filter illustrated in FIG. 3 is not provided. In other words, in the case where the resonant frequency of the acoustic wave resonator included in the parallel arm resonance portion is within the pass band BND1 of the transmission-side filter 20 or is lower than the pass band BND1, even when the electrostatic capacitance of the parallel arm resonance portion is increased, a region occurs where the pass band of the low pass filter overlaps the pass band BND1 of the transmission-side filter 20, and a portion can occur where isolation characteristics are not able to be effectively improved. Thus, when the resonant frequency of the acoustic wave resonator included in the parallel arm resonance portion is set to be higher than the pass band BND1 of the transmission-side filter 20, the entire range of the pass band BND1 of the transmission-side filter 20 can be included in an attenuation region of the low pass filter.

In such a configuration, an advantageous effect is more likely to be produced, in particular, in the case where a band gap between the pass band BND1 of the transmission-side filter 20 and the pass band BND2 of the reception-side filter 30 is not less than about 2%. Furthermore, in multiplexers, which are described with reference to FIGS. 12 and 13, including a plurality of transmission-side filters and/or a plurality of reception-side filters, an advantageous effect is also likely to be produced in the case where an interval between pass bands of filters is large and cross-isolation characteristics are demanded.

When the resonant frequency of the acoustic wave resonator included in the parallel arm resonance portion approaches the pass band BND2 of the reception-side filter 30, there is a possibility that the insertion loss of the reception-side filter 30 may deteriorate. In the case where the band gap is large, even if the resonant frequency of the acoustic wave resonator included in the parallel arm resonance portion is set to be higher than the pass band BND1 of the transmission-side filter 20, the resonant frequency can be kept away from the pass band BND2 of the reception-side filter 30. Thus, as the band gap increases, the insertion loss of the reception-side filter 30 is less likely to deteriorate.

Simulation Results

With respect to the multiplexer according to the present preferred embodiment (hereinafter, it is also referred to as a practical example.) and a multiplexer in a comparative example, results obtained by simulations of isolation characteristics will be described below with reference to FIGS. 4 to 11. Both of the multiplexers in the practical example and the comparative example have a basic configuration illustrated in FIG. 1 and are the same or substantially the same in specifications of elements other than the parallel arm resonance portions P11 to P14 illustrated in FIGS. 4 to 7.

In the simulations, as the parallel arm resonance portions P11 to P14, SAW resonators are used. As illustrated in FIG. 4, intersecting widths of IDT electrodes of the parallel arm resonance portions P11, P12, P13, and P14 are respectively about 36.3 μm, about 31.0 μm, about 15.3 μm, and about 29.8 μm in the practical example and are respectively about 15.3 μm, about 31.0 μm, about 36.3 μm, and about 29.8 μm in the comparative example.

Furthermore, as illustrated in FIG. 5, the numbers of pairs in the IDT electrodes of the parallel arm resonance portions P11, P12, P13, and P14 are respectively 129 pairs, 87 pairs, 145 pairs, and 52 pairs in the practical example and are respectively 145 pairs, 87 pairs, 129 pairs, and 52 pairs in the comparative example.

Figures 6, 7, 8:
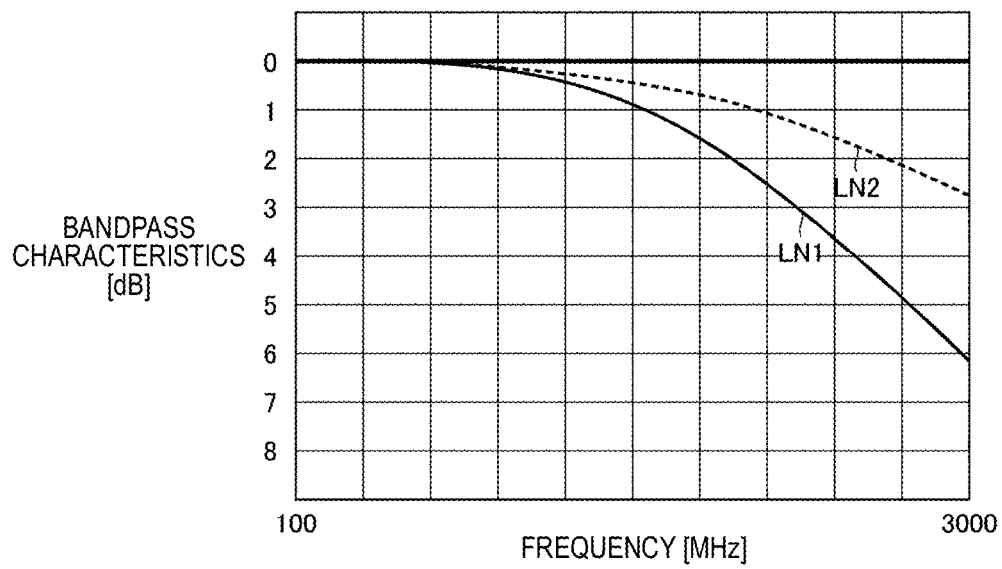
FIG. 6 illustrates an example of electrostatic capacitance of each of the parallel arm resonance portions in the reception-side filter in the practical example and the comparative example.
FIG. 7 illustrates an example of resonant frequencies of the parallel arm resonance portions in the reception-side filter in the practical example and the comparative example.
FIG. 8 illustrates a difference between bandpass characteristics of the low pass filter in the case where electrostatic capacitance in the practical example and electrostatic capacitance in the comparative example are used.

Electrostatic capacitance of a SAW resonator is typically proportionate to the product of an intersecting width and the number of pairs (intersecting width X the number of pairs) in an IDT electrode. Thus, as illustrated in FIG. 6, the electrostatic capacitance of the parallel arm resonance portion P11, the electrostatic capacitance of the parallel arm resonance portion P12, the electrostatic capacitance of the parallel arm resonance portion P13, and the electrostatic capacitance of the parallel arm resonance portion P14 are respectively about 2.05 pF, about 1.30 pF, about 0.97 pF, and about 0.14 pF in the practical example and are respectively about 0.97 pF, about 1.30 pF, about 2.05 pF, and about 0.14 pF in the comparative example. As seen from FIG. 6, in the practical example, the electrostatic capacitance of the parallel arm resonance portion P11 closest to the antenna terminal is larger than the electrostatic capacitance of each of the other parallel arm resonance portions P12, P13, and P14. Furthermore, in the order of the parallel arm resonance portions P12, P13, and P14, the electrostatic capacitance decreases. In the comparative example, the electrostatic capacitance of the parallel arm resonance portion P13 is largest.

As illustrated in FIG. 7, resonant frequencies of the parallel arm resonance portions P11, P12, P13 and P14 are respectively about 1884 MHz, about 1916 MHz, about 1911 MHz, and about 1911 MHz in the practical example and are respectively about 1895 MHz, about 1916 MHz, about 1906 MHz, and about 1911 MHz in the comparative example.

FIG. 8 illustrates bandpass characteristics (insertion loss) of the low pass filter defined by the inductor L11 and the parallel arm resonance portion P11 in the practical example and the comparative example. In FIG. 8, a solid line LN1 represents bandpass characteristics of the low pass filter in the practical example, and a dashed line LN2 represents bandpass characteristics of the low pass filter in the comparative example. As illustrated in FIG. 8, over an entire frequency range, attenuation in the practical example is larger than that in the comparative example. Thus, in the pass band BND1 of the transmission-side filter 20, attenuation in the practical example is larger than that in the comparative example.

Figure 9:
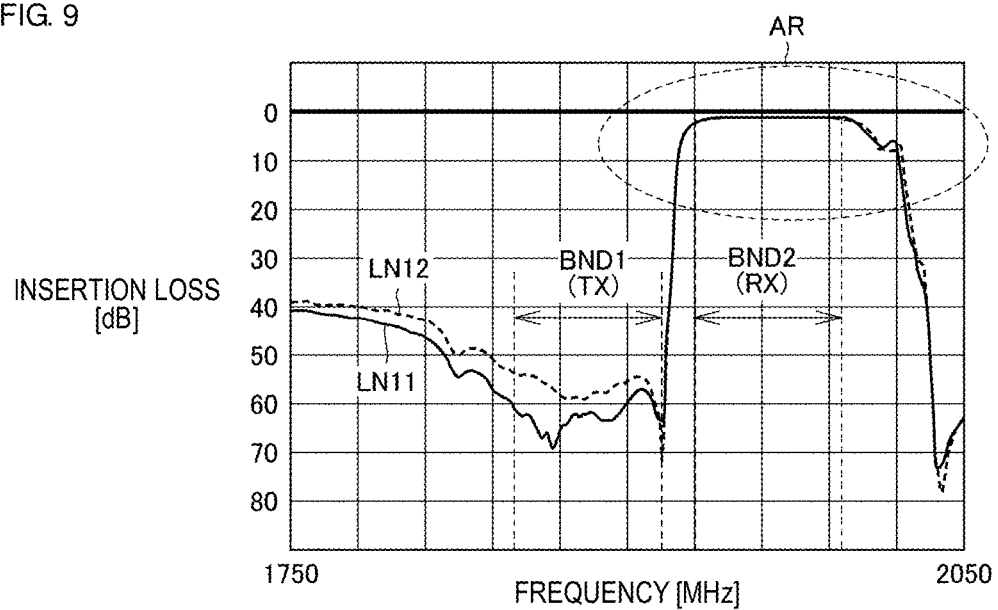
FIG. 9 illustrates bandpass characteristics in the reception-side filter in the practical example and the comparative example.
Figure 10:
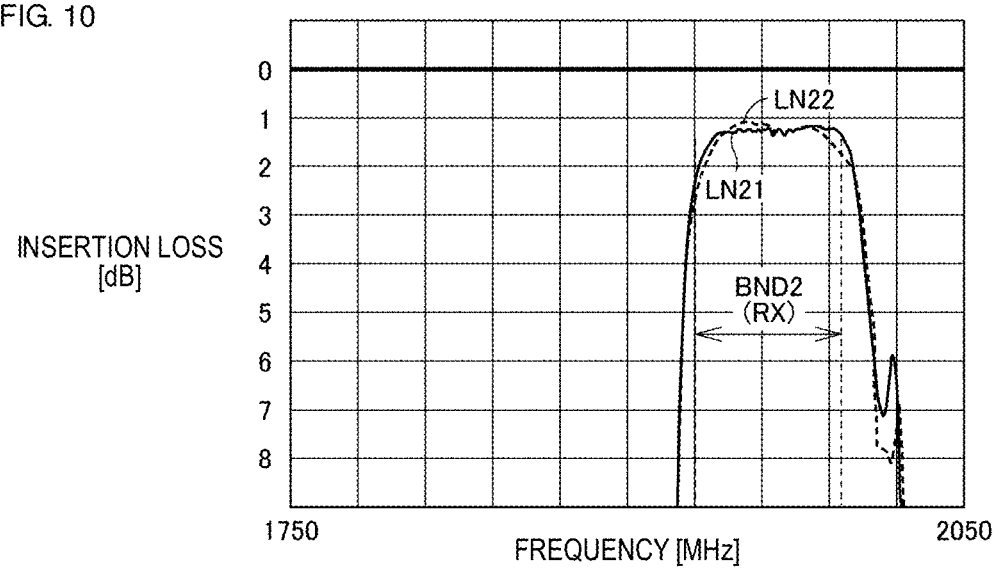
FIG. 10 is an enlarged view of the area of a region AR in FIG. 9.

FIGS. 9 and 10 illustrate bandpass characteristics in the reception-side filter 30 in the practical example and the comparative example. In FIGS. 9 and 10, the horizontal axis represents frequency, and the vertical axis represents insertion loss from the antenna terminal T1 to the reception terminal T3.

FIG. 10 is a view where the scale of the vertical axis is enlarged to distinguish a difference in a portion (region AR) of the pass band BND2 of the reception-side filter 30 in FIG. 9. In FIG. 9, a solid line LN11 represents the case of the practical example, and a dashed line LN12 represents the case of the comparative example. Furthermore, in FIG. 10, a solid line LN21 represents the case of the practical example, and a dashed line LN22 represents the case of the comparative example.

Referring to FIGS. 9 and 10, a maximum value of loss in the pass band BND2 of the reception-side filter 30 is about 2.32 dB in the practical example and is about 2.66 dB in the comparative example. The loss in the practical example is smaller than that in the comparative example.

On the other hand, with respect to loss in the pass band BND1, attenuation in the practical example is larger than that in the comparative example. In other words, in the practical example, more favorable isolation characteristics than those in the comparative example are obtained.

Figure 11:
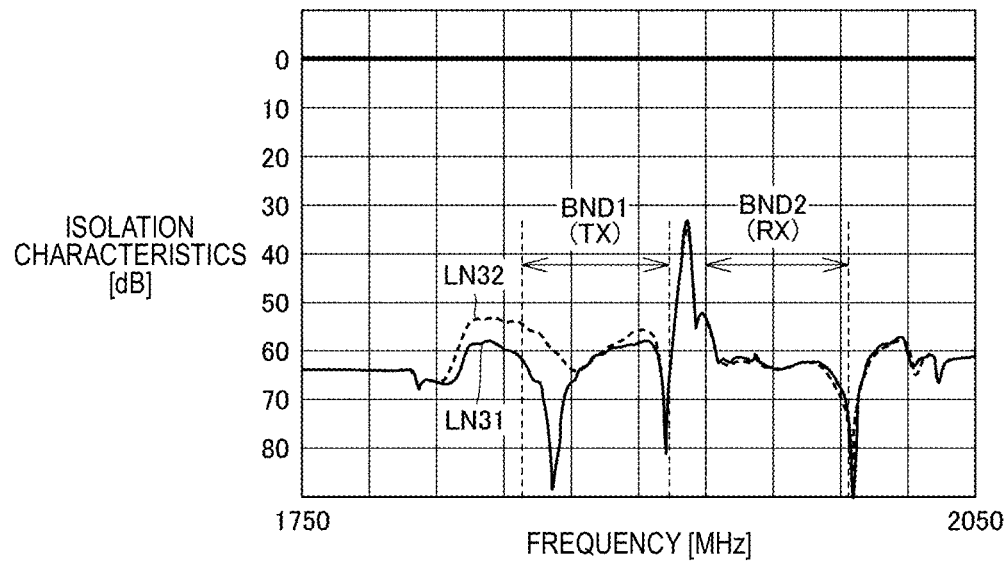
FIG. 11 illustrates isolation characteristics between a transmission-side filter and the reception-side filter in the practical example and the comparative example.

FIG. 11 illustrates isolation characteristics between the transmission-side filter 20 and the reception-side filter 30 in the practical example and the comparative example. In FIG. 11, the horizontal axis represents frequency, and the vertical axis represents insertion loss from the transmission terminal T2 to the reception terminal T3. In FIG. 11, a solid line LN31 represents the case of the practical example, and a dashed line LN32 represents the case of the comparative example.

As seen from simulation results in FIG. 11, in the pass band BND2 of the reception-side filter 30, similar characteristics are obtained both in the practical example and in the comparative example. On the other hand, in the pass band BND1 of the transmission-side filter 20, the insertion loss in the practical example reaches a maximum of about 58.0 dB, and the insertion loss in the comparative example reaches a maximum of about 55.9 dB. Furthermore, over the entire range of the pass band BND1, the insertion loss in the practical example is larger than the insertion loss in the comparative example. In other words, it is indicated that, in the practical example, more favorable isolation characteristics than those in the comparative example are obtained.

As described above, in a multiplexer including a ladder transmission-side filter and a ladder reception-side filter that are connected to a common antenna terminal, an inductance element is provided between the reception-side filter and the antenna terminal, and electrostatic capacitance of a parallel arm resonance portion closest to the antenna terminal in the reception-side filter is set to be larger than electrostatic capacitance of another parallel arm resonance portion, thus enabling an improvement in isolation characteristics between the transmission-side filter and the reception-side filter in a pass band of the transmission-side filter without causing loss of the reception-side filter to deteriorate.

In the above-described preferred embodiment, although an example has been described where a multiplexer is a duplexer including one transmission-side filter and one reception-side filter, the number of filters included in the multiplexer is not limited to this, and the preferred embodiment is applicable to a multiplexer including three or more filters.

Figure 12:
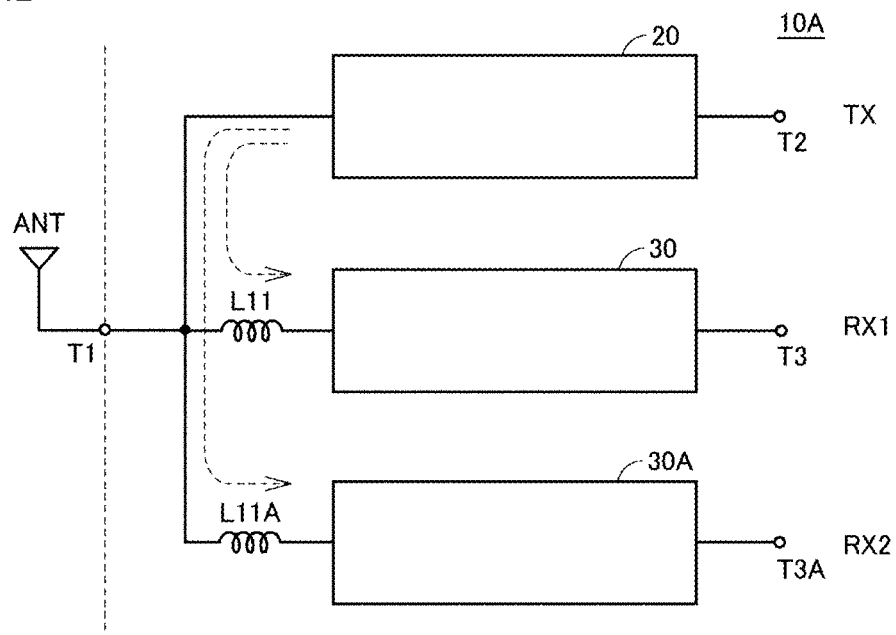
FIG. 12 illustrates a first example of a multiplexer according to a preferred embodiment of the present invention including three or more filters.

FIG. 12 illustrates an example of a multiplexer 10A used in the case where signals in two frequency bands are received. In addition to the transmission-side filter 20 and the reception-side filter 30 that are illustrated in FIG. 1, a reception-side filter 30A is further provided. In FIG. 12, a detailed configuration of each filter is omitted.

In such a configuration, for each of the reception-side filters 30 and 30A, a ladder filter is used, inductors L11 and L11A are disposed between the respective reception-side filters 30 and 30A and the antenna terminal T1, and electrostatic capacitance of a parallel arm resonance portion closest to the antenna terminal T1 is set to be larger than electrostatic capacitance of another parallel arm resonance portion, thus enabling improvements in isolation characteristics between the transmission-side filter 20 and the respective reception-side filters 30 and 30A without causing loss of each reception-side filter to deteriorate.

Figure 13:
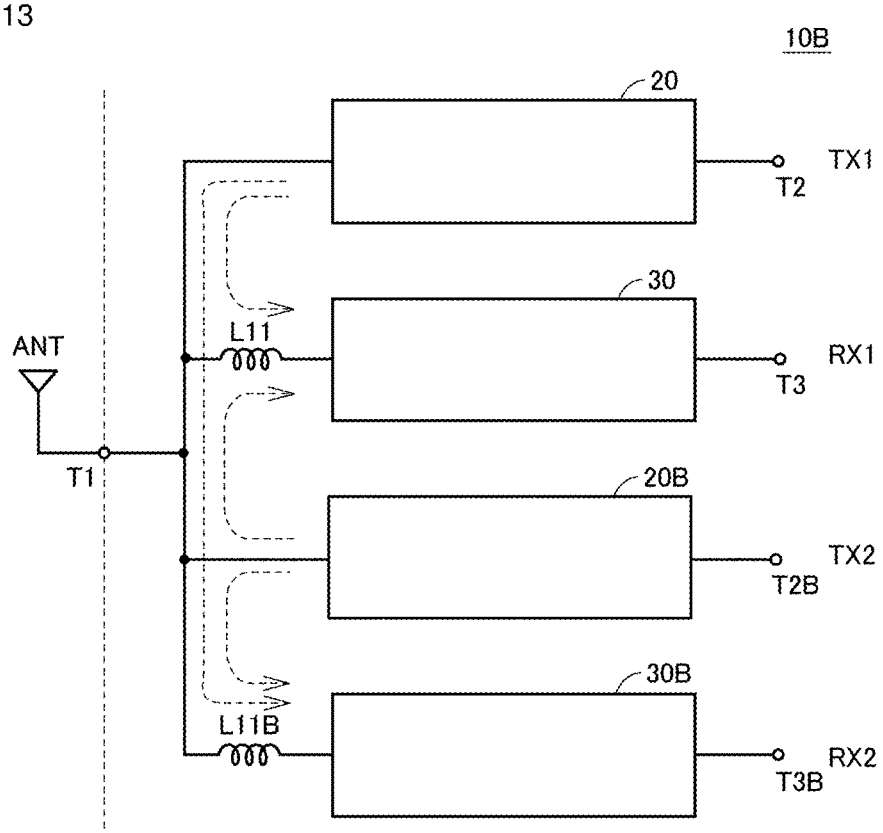
FIG. 13 illustrates a second example of a multiplexer including three or more filters according to a preferred embodiment of the present invention.

Furthermore, as illustrated in FIG. 13, in a multiplexer 10B including two transmission-side filters and two reception-side filters, inductors L11 and L11B are provided between respective reception-side filters 30 and 30B and the antenna terminal T1, and electrostatic capacitance of a parallel arm resonance portion is appropriately set, thus enabling improvements in isolation characteristics between the transmission-side filters and the reception-side filters in pass bands of transmission-side filters 20 and 20B.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
   an antenna terminal;
   an inductance element;
   a first acoustic wave filter connected to the antenna terminal and having a first pass band; and
   a second acoustic wave filter connected to the antenna terminal through the inductance element and having a second pass band; wherein
   a center frequency of the second pass band is higher than a center frequency of the first pass band;
   the second acoustic wave filter includes a plurality of parallel arm resonance portions including a first parallel arm resonance portion connected closest to the inductance element;
   an electrostatic capacitance of the first parallel arm resonance portion is larger than an electrostatic capacitance of any other parallel arm resonance portions of the plurality of parallel arm resonance portions;
   the first parallel arm resonance portion is connected to the inductance element without another parallel arm electrostatic capacitance element connected between the first parallel arm resonance portion and the inductance element; and
   the first parallel arm resonance portion is connected to antenna terminal without either of another electrostatic capacitance element or another inductance element, in addition to the inductance element, connected between the first parallel arm resonance portion and the antenna terminal.

2. The multiplexer according to claim 1, wherein the first acoustic wave filter includes a plurality of series arm resonance portions connected in series between the antenna terminal and a transmission terminal, and a plurality of parallel arm resonance portions.

3. The multiplexer according to claim 2, wherein each of the plurality of series arm resonance portions includes at least two acoustic wave resonators.

4. The multiplexer according to claim 2, wherein each of the plurality of parallel arm resonance portions includes at least one acoustic wave resonator.

5. The multiplexer according to claim 1, wherein the second acoustic wave filter includes a plurality of series arm portions.

6. The multiplexer according to claim 5, wherein each of the plurality of series arm portions includes at least one acoustic wave resonator.

7. The multiplexer according to claim 1, wherein an electrostatic capacitance of each of the plurality of parallel arm resonance portions increases as a distance to the antenna terminal decreases.

8. The multiplexer according to claim 1, wherein the second acoustic wave filter is a ladder filter.

9. The multiplexer according to claim 1, wherein a resonant frequency of the first parallel arm resonance portion is higher than a resonant frequency of the first pass band.

10. The multiplexer according to claim 1, wherein the first acoustic wave filter is a transmission-side filter, and the second acoustic wave filter is a reception-side filter.

11. The multiplexer according to claim 1, wherein a low pass filter is defined by the inductance element and the first parallel arm resonance portion.

12. The multiplexer according to claim 1, further comprising a third filter connected to the antenna terminal.

13. The multiplexer according to claim 1, wherein the first acoustic wave filer is a ladder filter.

14. The multiplexer according to claim 1, wherein the first pass band is in a range from about 1850 MHz to about 1915 MHz.

15. The multiplexer according to claim 1, wherein the second pass band is in a range from about 1930 MHz and about 1995 MHz.

16. The multiplexer according to claim 1, wherein each of the plurality of parallel arm portions includes at least one acoustic wave resonator.

17. A multiplexer comprising:
   an antenna terminal;
   an inductance element;
   a first acoustic wave filter connected to the antenna terminal and having a first pass band; and
   a second acoustic wave filter connected to the antenna terminal through the inductance element and having a second pass band; wherein
   a center frequency of the second pass band is higher than a center frequency of the first pass band;
   the second acoustic wave filter includes a plurality of parallel arm resonance portions including a first parallel arm resonance portion connected closest to the inductance element;
   an electrostatic capacitance of the first parallel arm resonance portion is larger than an electrostatic capacitance of any other parallel arm resonance portions of the plurality of parallel arm resonance portions;
   the first parallel arm resonance portion is connected to the inductance element without another parallel arm electrostatic capacitance element connected between the first parallel arm resonance portion and the inductance element;
   a low pass filter is defined by the inductance element and the first parallel arm resonance portion; and
   the first pass band is included in an attenuation region of the low pass filter.

\* \* \* \* \*